United States Patent
Kalwitz

(10) Patent No.: US 12,386,745 B2
(45) Date of Patent: Aug. 12, 2025

(54) DYNAMIC SINGLE-LEVEL CELL WRITE THROUGH IN MEMORY DEVICES

(71) Applicant: SK Hynix NAND Product Solutions Corp., Rancho Cordova, CA (US)

(72) Inventor: George Kalwitz, Mead, CO (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 103 days.

(21) Appl. No.: 18/388,782

(22) Filed: Nov. 10, 2023

(65) Prior Publication Data

US 2025/0156320 A1    May 15, 2025

(51) Int. Cl.
*G06F 12/0802*    (2016.01)
(52) U.S. Cl.
CPC ...... *G06F 12/0802* (2013.01); *G06F 2212/60* (2013.01)
(58) Field of Classification Search
CPC .......................... G06F 12/0802; G06F 2212/60
See application file for complete search history.

(56) References Cited

U.S. PATENT DOCUMENTS

2023/0051328 A1*    2/2023    Barczak ............. G06F 12/0873

\* cited by examiner

*Primary Examiner* — Aracelis Ruiz
(74) *Attorney, Agent, or Firm* — Morgan, Lewis & Bockius LLP

(57) ABSTRACT

This application is directed to writing data in a memory device supporting multiple bits per cell by dynamically using a y-level cell (YLC) cache. The memory device is coupled into a host device, and includes a plurality of x-level cell (XLC) memory blocks, where x is greater than one and greater than y. The memory device identifies a write shaping status of the host device. Based on the write shaping status, the memory device determines that the host device performs write operations without a memory-based cache. In accordance with a determination that the host device performs write operations without the memory-based cache, a YLC cache is allocated in the memory device to act as the memory-based cache. In response to one or more write requests, the memory device stores data into the plurality of XLC memory blocks via the YLC cache.

20 Claims, 6 Drawing Sheets

DYNAMIC SINGLE-LEVEL CELL WRITE THROUGH IN MEMORY DEVICES

TECHNICAL FIELD

This application relates generally to data write through including, but not limited to, methods, systems, and non-transitory computer-readable media for writing data in a memory device storing multiple bits per cell dynamically using a single-level cell (SLC) cache.

BACKGROUND

Memory is applied in a computer system to store instructions and data. Particularly, the computer system relies on non-volatile memory to keep instructions and data stored thereon if the computer system is decoupled from a power source. Examples of the non-volatile memory include, but are not limited to, hard disk drives (HDDs) and solid-state drives (SSDs). SSDs store data in NAND memory, which continues to evolve with higher data density to meet enterprise and consumer demands for high capacity, high performance, and cost effective data storage. The number of states in a memory cell increases from one bit (i.e. two possible states) per cell in a single-level cell (SLC) to multiple bits per cell. For example, NAND memory having four (4) possible states per cell may be referred to as multi-level cell (MLC) memory and may represent two (2) bits of data per cell: NAND memory having eight (8) possible states per cell may be referred to as triple-level cell (TLC) memory and may represent three (3) bits of data per cell: NAND memory having sixteen (16) possible states per cell may be referred to as quad-level cell (QLC) memory and may represent four (4) bits of data per cell: and NAND memory having thirty-two (32) possible states per cell may be referred to as penta-level cell (PLC) memory and may represent five (5) bits of data per cell. In one scenario, memory supporting multiple bits per cell receives write data in small regions, and these small writes need to be aggregated until there is enough data to complete an entire write cycle. In another scenario, memory supporting multiple bits per cell receives write data in large regions, and write cycles can be completed directly without data aggregation. It would be beneficial to develop a mechanism for managing data writing in memory devices of an electronic system to operate in all these scenarios.

SUMMARY

Various embodiments of this application are directed to methods, systems, devices, and non-transitory computer-readable media for writing data in memory devices storing multiple bits per cell dynamically using an SLC cache. The memory devices are coupled to a host device in an electronic system (e.g. a computer system). In some embodiments, firmware in the memory devices dynamically detects a host workload of the host device to identify whether write shaping is used. Based on the identification, the SLC cache is engaged or disengaged. In some embodiments, write bands are converted between SLC and x-level cell (XLC) on the fly. In some embodiments, the number of SLC bands or the size of the SLC cache is dynamically adjusted based on the host workload.

In one aspect, a method is implemented at an electronic device or a memory system including a host device and a memory device. The method includes identifying a write shaping status of the host device. The memory device is coupled to the host device and includes a plurality of XLC memory blocks, where x is greater than one. The method further includes based on the write shaping status, determining that the host device performs write operations without a memory-based cache. The method further includes in accordance with a determination that the host device performs write operations without the memory-based cache, allocating an SLC cache in the memory device to act as the memory-based cache. The method further includes in response to one or more write requests, storing data into the plurality of XLC memory blocks via the SLC cache in the memory device.

In some embodiments, the identifying the write shaping status includes receiving a notification by the memory device from the host device, and determining the write shaping status of the host device by determining, based on the notification, whether the host device supports write operations via the memory-based cache. The SLC cache is allocated for writing data in the memory device when the host device does not support write operations via the memory-based cache.

In some embodiments, the identifying the write shaping status includes receiving at least one write command by the memory device from the host device for writing host data, detecting an input/output (I/O) pattern based on the at least one write command, and determining the write shaping status of the host device by determining whether the I/O pattern indicates sequential data regions or random data regions with respect to logical block addressing (LBA). The SLC cache is allocated for writing data in the memory device when the I/O pattern indicates random data regions with respect to LBA.

Some implementations of this application include a memory device that includes a plurality of XLC memory blocks (where x is greater than one), an SLC cache, and a memory controller operable to execute instructions which when executed cause the memory controller to perform any of the above methods on a memory system (e.g., including one or more SSDs).

Some implementations of this application include an electronic system that includes a host device, and a memory device coupled to the host device and configured to perform any of the above methods on a memory system (e.g., including one or more SSDs).

Some implementations include a non-transitory computer readable storage medium storing one or more programs. The one or more programs include instructions, which when executed by one or more processors cause the processors to implement any of the above methods on a memory system (e.g., including one or more SSDs).

These illustrative embodiments and implementations are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

Like reference numerals refer to corresponding parts throughout the several views of the drawings.

DETAILED DESCRIPTION

Figure 1:
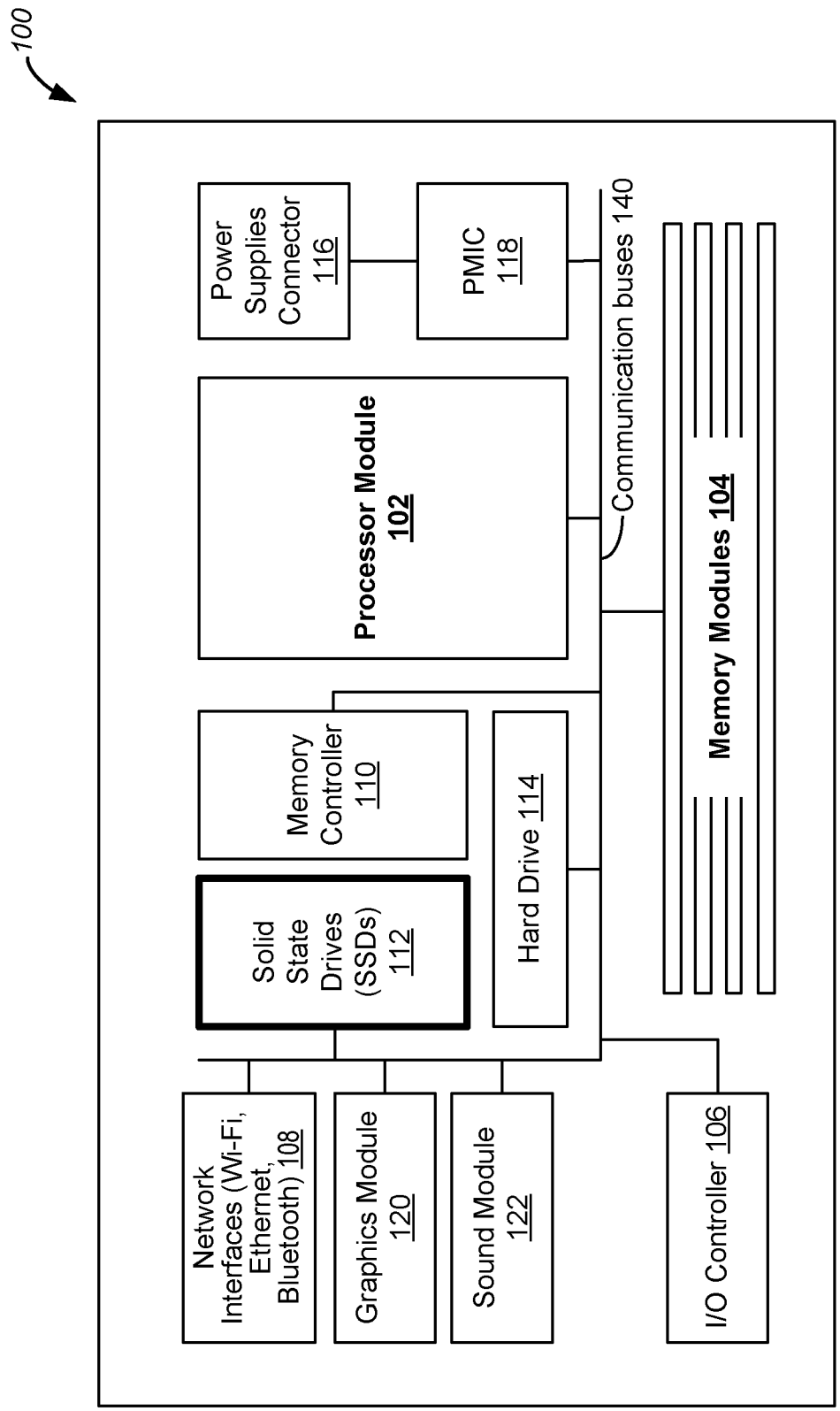
FIG. 1 is a block diagram of an example system module in a typical electronic system, in accordance with some embodiments of the present teaching.

Reference will now be made in detail to specific embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details. For example, it will be apparent to one of ordinary skill in the art that the subject matter presented herein can be implemented on any types of electronic systems or devices with data storage capabilities.

As a NAND memory, e.g. SSD, evolves from SLC to MLC, TLC, QLC, PLC with higher and higher data density, more and more data is needed to complete a full programming or writing cycle. For example, a PLC media may require 5 to 10 megabytes (MB) of data to complete a full multi-pass programming cycle. In some use cases, storage servers in a modern data center shape large write regions for the SSD in an effort to reduce or eliminate garbage collection, where there is enough data available to complete a PLC programming cycle. In other user cases, a legacy storage host does not shape writes, such that the SSD receives write data as small as a single sector. In these user cases, the SSD must aggregate these small writes until there is enough data to complete a PLC programming cycle.

Various embodiments of the present teaching are directed to methods, systems, devices, non-transitory computer-readable media for writing data in a memory device supporting multiple bits per cell by dynamically using a portion of the memory device as an SLC write cache. In some embodiments, the memory device includes single dynamic firmware, which simplifies operations and reduces cost both internally and for customers. This allows the memory device, e.g. SSD, to function in any of the above mentioned use cases dynamically and automatically. In some embodiments, the single dynamic firmware dynamically detects a workload of the host device coupled to the memory device to identify whether write shaping is used. In accordance with a determination whether write shaping is used, the SLC write cache is engaged or disengaged, and bands are converted between SLC and PLC on the fly. The size of the SLC write cache is dynamically adjusted based on the host workload. While the following description will focus on a memory device supporting PLC, it can be understood that the same systems and methods also apply to other memory devices supporting multiple bits per cell, e.g. MLC, TLC, QLC, XLC (x-level cell). While the following description will focus on a memory device supporting XLC (x-level cell) with a dynamic SLC write cache, it can be understood that the same systems and methods also apply to other memory devices supporting XLC (x-level cell) with a dynamic YLC (y-level cell) write cache, where y is less than x.

In some embodiments, write shaping is an aggregation of small writes into large writes. Write shaping can be done by the host device or by the memory device. When the host device shapes writes, it shapes writes in a write cache within the host device. When the memory device shapes writes, the SLC cache is engaged to shape writes.

In some embodiments, write shaping occurs in the host device, and a very large amount of data is accumulated before sending write commands to the memory device. For example, a host can accumulate 1 GB of write data before sending it to the memory device. The 1 GB buffer is contiguous or scattered in host memory (a write cache in the host device). In some embodiments, the entire buffer is sequential with respect to logical block addressing (LBA). A host may apply multiple writers/workers to send the data to the memory device. Each writer typically sends a different section within the large write buffer. The LBAs are sequential or pseudo sequential from the starting point. In some situations, a host-based write shaping is performed by the host device, and the memory device receives multiple streams of sequential write commands. In some situations, the host write workload is random, and the write shaping is not present in the host device.

In some embodiments, the host-based write shaping is detected during device discovery, when the host device and the memory device negotiate operating parameters, e.g. via a non-volatile memory express (NVMe), identify a controller (IDC) protocol, and adopt the NVMe standard. Further, under some circumstances, the host device identifies itself being capable of write shaping, and the memory device disengages SLC write through, i.e. writing data into PLC blocks without creating or using the SLC write cache. In some embodiments, the host device identifies itself as not supporting the host-based write shaping. The memory device will engage SLC write through, i.e. writing data into PLC blocks through the SLC write cache. In some embodiments, the host device also communicates its write bandwidth requirements in terms of burst and/or sustained MB data per second needed, allowing the memory device to adjust the size of the SLC write cache in the memory device.

In some embodiments, a host-based write shaping is detected during the handling of write input/output (I/O) commands. In some situations, the memory device detects a write I/O pattern indicative of host-based write shaping in which write commands describe large sequential data regions, and the memory device triggers a disablement of SLC write through. Accordingly, the memory device writes data into PLC blocks without creating or using the SLC write cache (called a shaped-write mode), and converts any SLC band back to PLC. In some situations, the memory device detects a purely random write I/O pattern, and the memory device engages SLC write through. Accordingly, the memory device converts corresponding media bands to SLC, and writes data into PLC blocks through the SLC write cache including the SLC bands (called an SLC write through mode). In some embodiments, memory devices operating in SLC write through mode respond to write commands in a different manner from memory devices operating in write-shaped mode. A memory device operating in SLC write through mode would respond to host's write commands individually and very quickly. A memory device operating in shaped-write mode would consume and process a large amount of write data before responding to the write commands.

In some embodiments, the number of SLC bands and/or the size of the SLC write cache is dynamic, depending on the host device's behavior and the write pressure applied to the memory device. If the host device delivers write pressure in bursts, the memory device needs a smaller SLC cache. If the host device delivers a more sustained write pressure, the memory device needs a larger SLC cache to absorb the workload.

FIG. 1 is a block diagram of an example system module 100 in a typical electronic system in accordance with some embodiments. The system module 100 in this electronic system includes at least a processor module 102, memory modules 104 for storing programs, instructions and data, an input/output (I/O) controller 106, one or more communication interfaces such as network interfaces 108, and one or more communication buses 140 for interconnecting these components. In some embodiments, the I/O controller 106 allows the processor module 102 to communicate with an I/O device (e.g., a keyboard, a mouse or a track-pad) via a universal serial bus interface. In some embodiments, the network interfaces 108 includes one or more interfaces for Wi-Fi, Ethernet and Bluetooth networks, each allowing the electronic system to exchange data with an external source, e.g., a server or another electronic system. In some embodiments, the communication buses 140 include circuitry (sometimes called a chipset) that interconnects and controls communications among various system components included in system module 100.

In some embodiments, the memory modules 104 include high-speed random-access memory, such as dynamic random-access memory (DRAM), static random-access memory (SRAM), double data rate (DDR) DRAM, or other random-access solid state memory devices. In some embodiments, the memory modules 104 include non-volatile memory, such as one or more magnetic disk storage devices, optical disk storage devices, flash memory devices, or other non-volatile solid state storage devices. In some embodiments, the memory modules 104, or alternatively the non-volatile memory device(s) within the memory modules 104, include a non-transitory computer readable storage medium. In some embodiments, memory slots are reserved on the system module 100 for receiving the memory modules 104. Once inserted into the memory slots, the memory modules 104 are integrated into the system module 100.

In some embodiments, the system module 100 further includes one or more components selected from a memory controller 110, SSDs 112, a hard disk drive (HDD) 114, power management integrated circuit (PMIC) 118, a graphics module 120, and a sound module 122. The memory controller 110 is configured to control communication between the processor module 102 and memory components, including the memory modules 104, in the electronic system. The SSDs 112 are configured to apply integrated circuit assemblies to store data in the electronic system, and in many embodiments, are based on NAND or NOR memory configurations. The HDD 114 is a conventional data storage device used for storing and retrieving digital information based on electromechanical magnetic disks. The power supply connector 116 is electrically coupled to receive an external power supply. The PMIC 118 is configured to modulate the received external power supply to other desired DC voltage levels, e.g., 5V, 3.3V or 1.8V, as required by various components or circuits (e.g., the processor module 102) within the electronic system. The graphics module 120 is configured to generate a feed of output images to one or more display devices according to their desirable image/video formats. The sound module 122 is configured to facilitate the input and output of audio signals to and from the electronic system under control of computer programs. The communication buses 140 also interconnect and control communications among various system components including components 110-122.

Further, one skilled in the art knows that other non-transitory computer readable storage media can be used, as new data storage technologies are developed for storing information in the non-transitory computer readable storage media in the memory modules 104 and in SSDs 112. These new non-transitory computer readable storage media include, but are not limited to, those manufactured from biological materials, nanowires, carbon nanotubes and individual molecules, even though the respective data storage technologies are currently under development and yet to be commercialized.

Figure 2:
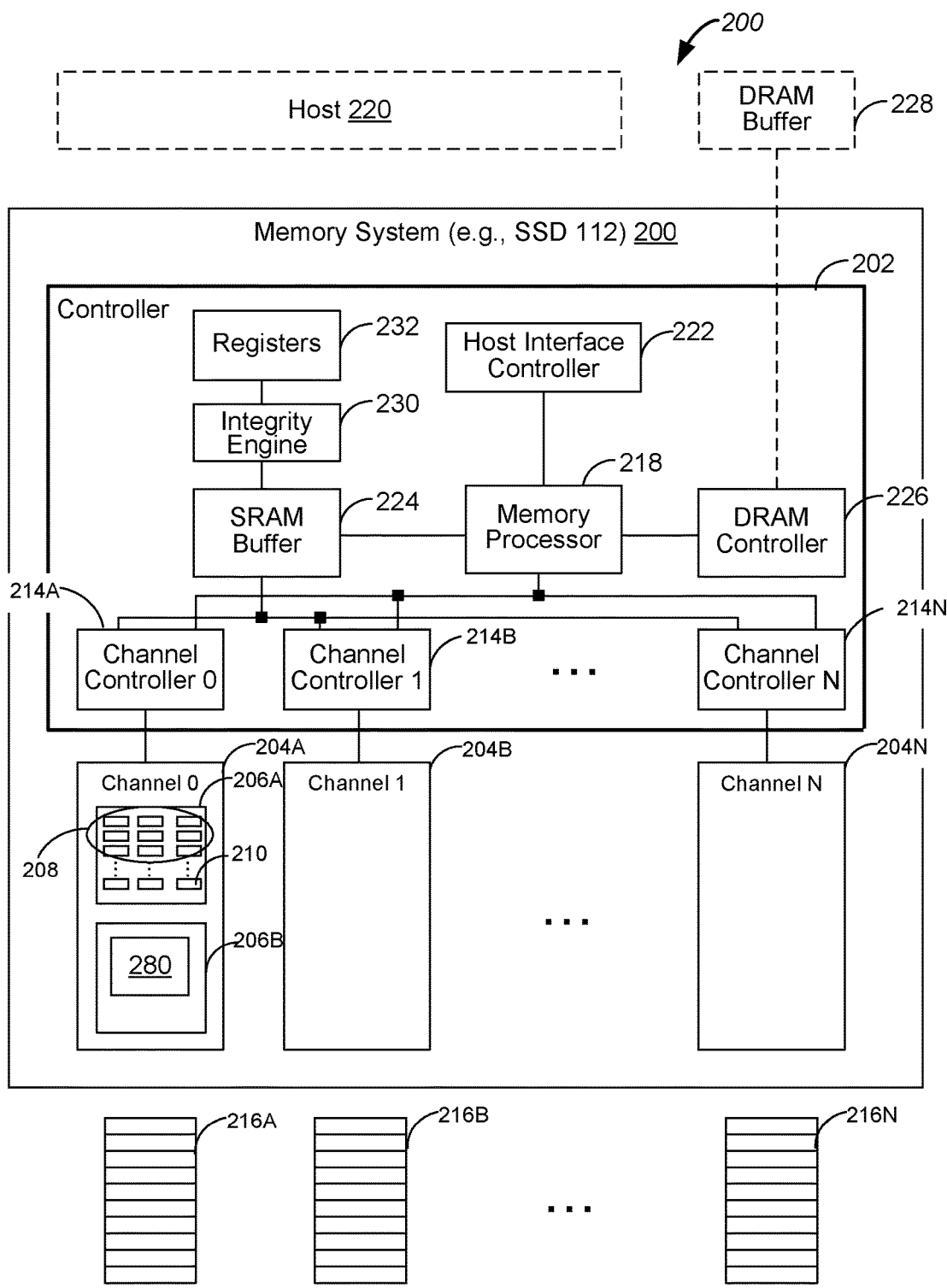
FIG. 2 is a block diagram of a memory system of an example electronic device having one or more memory access queues, in accordance with some embodiments of the present teaching.

FIG. 2 is a block diagram of a memory system 200 of an example electronic system having one or more memory access queues, in accordance with some embodiments. The memory system 200 is coupled to a host device 220 (e.g., a processor module 102 in FIG. 1) and configured to store instructions and data for an extended time, e.g., when the electronic system sleeps, hibernates, or is shut down. The host device 220 is configured to access the instructions and data stored in the memory system 200 and process the instructions and data to run an operating system and execute user applications. The memory system 200 further includes a memory controller 202 and a plurality of memory channels 204 (e.g., channels 204A, 204B, and 204N). Each memory channel 204 includes a plurality of memory cells. The memory controller 202 is configured to execute firmware level software to bridge the plurality of memory channels 204 to the host device 220. In some embodiments, a set of memory channels 204 forms a memory device (e.g., a SSD). In some embodiments, the memory system 200 includes one or more memory devices.

Each memory channel 204 includes one or more memory packages. In an example, each memory package includes a memory die 206 (e.g., memory die 206A or 206B). In another example, each memory package has two or more memory dies 206. Each memory package includes a plurality of memory planes 208, and each memory plane 208 further includes a plurality of memory pages 210. Each memory page 210 includes an ordered set of memory cells, and each memory cell is identified by a respective physical address.

In some examples, a memory device includes 8 memory channels 204, and each memory channel 204 further includes 8 memory dies 206. Each memory die 206 includes 2 memory planes 208 or arrays. Each memory plane 208 further includes a plurality of memory pages 210. Each memory page 210 includes an ordered set of memory cells, and each memory cell is identified by a respective physical address.

In some embodiments, the memory system 200 includes an SLC NAND flash memory chip, and each memory cell stores a single data bit. In some embodiments, the memory system 200 includes a multi-level cell (MLC) NAND flash memory chip, and each memory cell stores 2 data bits. In an example, each memory cell of a triple-level cell (TLC) NAND flash memory chip stores 3 data bits. In another example, each memory cell of a quad-level cell (QLC) NAND flash memory chip stores 4 data bits. In yet another example, each memory cell of a penta-level cell (PLC) NAND flash memory chip stores 5 data bits. In some embodiments, each memory cell can store any suitable number of data bits. Compared with the non-SLC NAND flash memory chips (e.g., MLC SSD, TLC SSD, QLC SSD, PLC SSD), the SSD that has SLC NAND flash memory chips operates with a higher speed, a higher reliability, and a longer lifespan, and however, has a lower device density and a higher price.

Each memory channel 204 is coupled to a respective channel controller 214 (e.g., channel controller 214A, 214B, or 214N) configured to control internal and external requests to access memory cells in the respective memory channel 204. In some embodiments, each memory package (e.g., each memory die) corresponds to a respective queue 216 (e.g., queue 216A, 216B, or 216N) of memory access requests. In some embodiments, each memory channel 204 corresponds to a respective queue 216 of memory access requests. Further, in some embodiments, each memory channel 204 corresponds to a distinct and different queue 216 of memory access requests. In some embodiments, a subset (less than all) of the plurality of memory channels 204 corresponds to a distinct queue 216 of memory access requests. In some embodiments, all of the plurality of memory channels 204 of the memory system 200 corresponds to a single queue 216 of memory access requests. Each memory access request is optionally received internally from the memory system 200 to manage the respective memory channel 204 or externally from the host device 220 to write or read data stored in the respective channel 204. Specifically, each memory access request includes one of: a system write request that is received from the memory system 200 to write to the respective memory channel 204, a system read request that is received from the memory system 200 to read from the respective memory channel 204, a host write request that originates from the host device 220 to write to the respective memory channel 204, and a host read request that is received from the host device 220 to read from the respective memory channel 204. It is noted that system read requests (also called background read requests or non-host read requests) and system write requests are dispatched by a memory controller to implement internal memory management functions including, but are not limited to, garbage collection, wear levelling, read disturb mitigation, memory snapshot capturing, memory mirroring, caching, and memory sparing.

In some embodiments, in addition to the channel controllers 214, the memory controller 202 further includes a memory processor 218, a host interface controller 222, an SRAM buffer 224, and a DRAM controller 226. The memory processor 218 accesses the plurality of memory channels 204 based on the one or more queues 216 of memory access requests. In some embodiments, the memory processor 218 writes into and reads from the plurality of memory channels 204 on a memory block basis. Data of one or more memory blocks are written into, or read from, the plurality of channels jointly. No data in the same memory block is written concurrently via more than one operation. Each memory block optionally corresponds to one or more memory pages. In an example, each memory block to be written or read jointly in the plurality of memory channels 204 has a size of 16 KB (e.g., one memory page). In another example, each memory block to be written or read jointly in the plurality of memory channels 204 has a size of 64 KB (e.g., four memory pages). In some embodiments, each page has 16 KB user data and 2 KB metadata. Additionally, a number of memory blocks to be accessed jointly and a size of each memory block are configurable for each of the system read, host read, system write, and host write operations.

In some embodiments, the memory processor 218 stores data to be written into, or read from, each memory block in the plurality of memory channels 204 in an SRAM buffer 224 of the memory controller 202. Alternatively, in some embodiments, the memory processor 218 stores data to be written into, or read from, each memory block in the plurality of memory channels 204 in a DRAM buffer 228 that is in memory system 200. Alternatively, in some embodiments, the memory processor 218 stores data to be written into, or read from, each memory block in the plurality of memory channels 204 in a DRAM buffer 228 that is main memory used by the processor module 102 (FIG. 1). The memory processor 218 of the memory controller 202 accesses the DRAM buffer 228 via the host interface controller 222.

In some embodiments, data in the plurality of memory channels 204 is grouped into coding blocks, and each coding block is called a codeword. For example, each codeword includes n bits among which k bits correspond to user data and (n–k) corresponds to integrity data of the user data, where k and n are positive integers. In some embodiments, the memory system 200 includes an integrity engine 230 (e.g., an LDPC engine) and a registers 232 including a plurality of registers or SRAM cells or flip-flops and coupled to the integrity engine 230. The integrity engine 230 is coupled to the memory channels 204 via the channel controllers 214 and SRAM buffer 224. Specifically, in some embodiments, the integrity engine 230) has data path connections to the SRAM buffer 224, which is further connected to the channel controllers 214 via data paths that are controlled by the memory processor 218. The integrity engine 230 is configured to verify data integrity for each coding block of the memory channels 204 using variable nodes and check nodes, and messages are exchanged between the variable and check nodes during the integrity check process. A subset of these messages is selected and temporarily stored in the registers 232 as variable node data or check node data.

In various embodiments of this application, the memory controller 202 is coupled to a local controller 280 disposed within a memory package, a memory die 206, or a memory plane 208. A memory system 200 includes a plurality of memory packages. In at least a subset of memory packages, each respective memory package includes a local controller 280 for monitoring and reporting validity conditions of its pages. The local controller 280 is configured to receive an inquiry for a validity condition of a page of the respective memory package from the memory controller 202, verify data integrity for each codeword in a subset of the page, and determine an error parameter of the page based on validity results of the subset of the page. The error parameter of the page is determined locally within the local controller 280 and reported to the memory controller 202 via an input/output (I/O) bus. By these means, the memory controller 202 only sends the inquiry for the validity condition of the page of the memory device and receives the error parameter via the I/O bus connecting to the memory channels 204, while no memory data needs to be communicated via the I/O bus.

Figure 3:
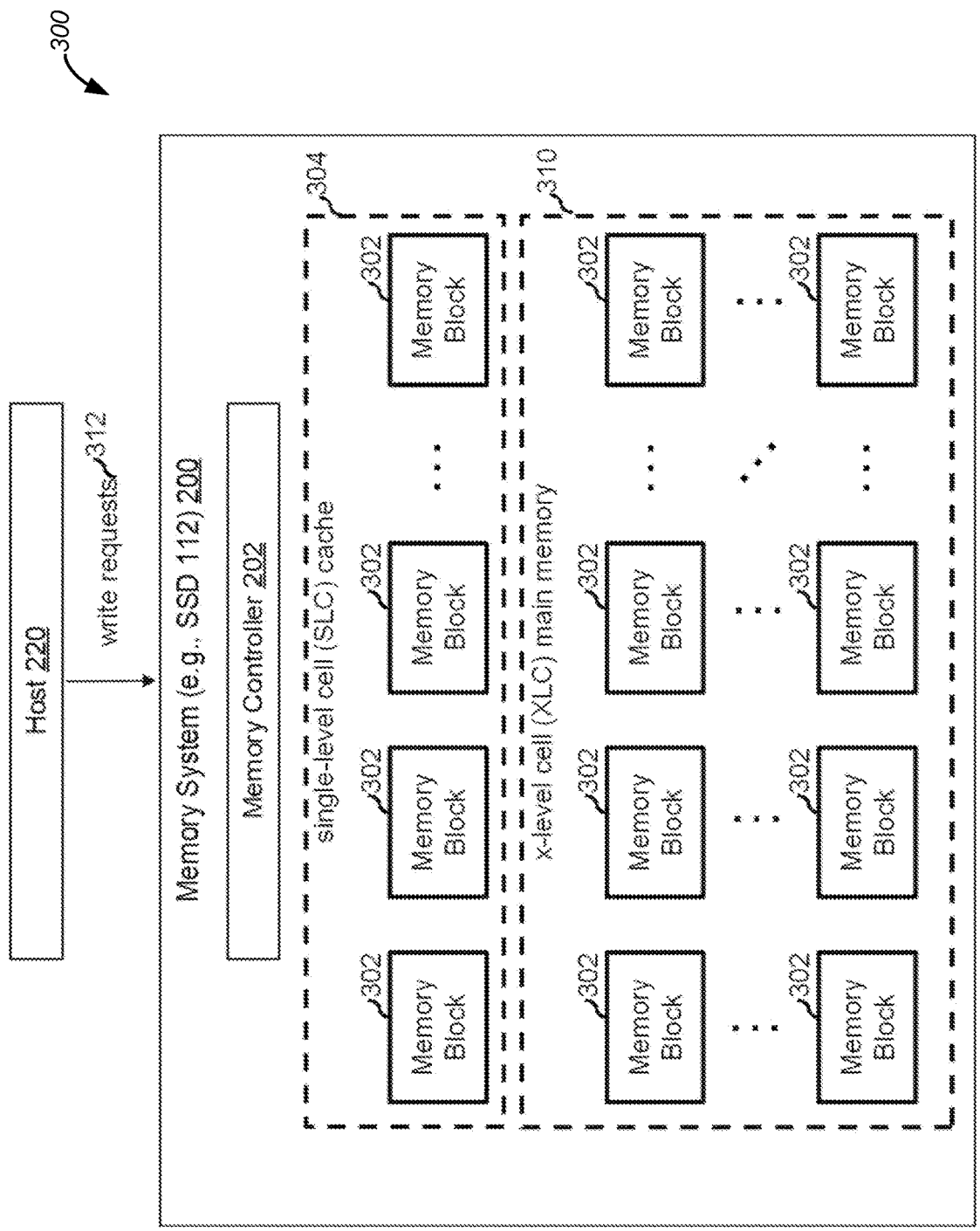
FIG. 3 is a block diagram of an example electronic system, in accordance with some embodiments of the present teaching.

FIG. 3 is a block diagram of an example electronic system 300, in accordance with some embodiments. The electronic system 300 includes a host device 220 (e.g., a processor module 102 in FIG. 1) and a memory system 200 coupled to the host device 220. The memory system 200 is configured to store instructions and data for an extended time, e.g., when the electronic system 300 sleeps, hibernates, or is shut down. The host device 220 is configured to access the instructions and data stored in the memory system 200 and process the instructions and data to run an operating system and execute user applications. The memory system 200 further includes a plurality of memory blocks 302. Each memory blocks 302 includes one or more memory pages 210 each having a plurality of memory cells. The memory controller 202 is configured to execute firmware level software to bridge the plurality of memory blocks 302 to the host device 220.

In some embodiments, the electronic system 200 includes an SLC cache 304, which includes one or more memory blocks. The memory blocks in the SLC cache 304 are a subset of the plurality of memory blocks 302, i.e. the SLC cache 304 covers a subset of the dies 411, 412, 413. In some embodiments, the memory controller 202 selects the subset of memory blocks to form the SLC cache 304. In some embodiments, the SLC cache 304 is formed by a portion of each of the subset of memory blocks. In some embodiments, the remaining or non-selected memory blocks 302 outside the SLC cache 304 forms an XLC main memory portion 310.

In some embodiments, each of the plurality of memory blocks 302 is initially configured to store multiple bits per cell, e.g. 5 bits per cell as a PLC memory block. Once one of the plurality of memory blocks 302 is selected to be part of the SLC cache 304, the selected memory block stores a single bit per cell. For example, the selected memory block is converted from a PLC type block to an SLC type block. In some embodiments, a portion of the selected memory block includes a set of memory cells, and each cell in the set of memory cells is converted from a PLC type cell to an SLC type cell. In some embodiments, while most of the plurality of memory blocks 302 are initially configured to store multiple bits per cell, e.g. 5 bits per cell as PLC memory blocks in the XLC main memory portion 310, some of the plurality of memory blocks 302 are initially configured to store a single bit per cell as SLC blocks in the SLC cache 304. In some embodiments, after the initial setup, a memory block or memory cell is selected to be part of the SLC cache 304 or the XLC main memory portion 310 dynamically.

As discussed above, a PLC memory device may require 5 to 10 MB of data to complete a full multi-pass programming cycle. In some scenarios, a host device can deliver 5 to 10 MB of data per die. In other scenarios, a host device cannot deliver that much data at once. The SLC cache 304 can be used as a write memory cache to accumulate small writes into 5 to 10 MB of program data for completing a writing cycle for a PLC memory.

In some use cases, when the host device 220 is a host in a personal computer (PC), it sends bursty write data to the memory system 200 with sizes as small as 512 bytes. In some use cases, when the host device 220 is a host in a data center (DC) server, it sends sustained write data to the memory system 200 with a larger size, e.g. 5 MB, 10 MB, or even larger. In some use cases, the host device 220 directs write data to different bands and/or dies in a placement mode, e.g. a flexible data placement (FDP) mode. Each use case desires a different configuration for the SLC cache 304. For example, an SLC cache having a smaller size is sufficient for a PC: but a DC server wants an SLC cache having a larger size. Some DC server does not need an SLC cache: and an SLC cache may not be viable with placement modes, which reduce or eliminate garbage collection inside the memory system 200.

As such, in some embodiments, the SLC cache 304 is configured to be a dynamic cache which may or may not be engaged during a data writing cycle of the memory system 200. In some embodiments, each of the plurality of memory blocks 302 is an XLC memory block storing x bits per cell, where x is greater than one. The memory system 200 identifies, e.g. by the memory controller 202, a write shaping status of the host device 220. Based on the write shaping status, the memory system 200 determines that the host device 220) performs write operations with or without a memory-based cache. In accordance with a determination that the host device 220 performs write operations without the memory-based cache, the SLC cache 304 is allocated and engaged in the memory system 200 to act as the memory-based cache. In response to one or more write requests 312, the memory system 200 stores data into the plurality of XLC memory blocks in the XLC main memory portion 310 via the SLC cache 304.

In some embodiments, the write shaping status of the host device 220) is identified based on: receiving a notification by the memory system 200 from the host device 220, and determining the write shaping status of the host device 220 by determining, based on the notification, whether the host device 220 supports write operations via the memory-based cache. The SLC cache 304 is allocated for writing data in the memory system 200 when the host device 220) does not support write operations via the memory-based cache.

In some embodiments, the notification includes at least one of: an identify controller (IDC) command received during device discovery, a get/set features (GSF) notification, a write pressure bandwidth requirement, a write-shaping notification, or a shaping size notification. The IDC command, the GSF feature, and the write-shaping notifications can indicate whether the host device 220 supports write shaping, i.e. accumulating write data via a memory-based cache in the host device 220 to a predetermined size before sending a write request 312. In some embodiments, the predetermined size is indicated by the shaping size notification, e.g. as 10 MB per stream. The write pressure bandwidth requirement indicates a bandwidth requirement for a bursty write pressure or a sustained write pressure, which in turn indicates whether the write data from the host device 220 to the memory system 200 has a sufficient size to complete a full write cycle for the XLC memory blocks.

In some embodiments, the memory system 200 dynamically detects, e.g. by the memory controller 202, a use case of the host device 220, and autonomously configures the SLC cache 304 accordingly for data writing. In some examples, the SLC cache 304 is enabled and configured with a smaller size (e.g. less than 1 MB) in bursty small-block write environment. In some examples, the SLC cache 304 is enabled and configured with a larger size (e.g. larger than 1 MB and less than 10 MB) in a multi-tenant large-block write environment. In some examples, the SLC cache 304 is adjusted on the fly to increase or decrease its size. In some examples, the SLC cache 304 is disabled in a very-large-block (e.g. larger than 10 MB) or sequential write environment.

In some embodiments, the memory system 200 receives at least one write command or write request 312 from the host device 220 for writing host data, and detects an input/output (I/O) pattern based on the at least one write command. Then, the memory system 200 determines, e.g. by the memory controller 202, the write shaping status of the host device 220 by determining whether the I/O pattern indicates sequential data regions or random data regions with respect to logical block addressing (LBA). The SLC cache 304 is allocated and engaged for writing data in the memory system 200 when the I/O pattern indicates random data regions with respect to LBA. The SLC cache 304 is not allocated or engaged for writing data in the memory system 200 when the I/O pattern indicates sequential data regions with respect to LBA.

In some embodiments, the memory system 200 receives host data from the host device 220 according to the one or more write requests 312. After the SLC cache 304 is allocated, the memory system 200 stores the host data in the memory system 200 by: writing the host data in a plurality of memory blocks in the SLC cache 304, and moving data from the SLC cache 304 to one or more memory blocks in the XLC main memory portion 310 when the SLC cache 304 is full or reaches a predetermined amount of data storage. In some embodiments, each of the plurality of memory blocks in the SLC cache 304 is located in a different die of the memory system 200 respectively.

On one hand, the SLC cache 304 simplifies integration and maximizes efficiency of an XLC (e.g. PLC) memory system 200. On the other hand, the SLC cache 304 steals capacity from the XLC (e.g. PLC) memory system 200, and affects endurance and performance of the memory system 200. As such, it is better to dynamically control the size of the SLC cache 304 in various environments.

In some embodiments, the memory system 200 keeps monitoring, e.g. by the memory controller 202, write environment information for writing data in the memory system 200, and dynamically adjust a size of the SLC cache 304 based on the write environment information. In some embodiments, the write environment information includes at least one of: information related to an IDC command received during device discovery, a write workload detected from the host device 220, a write pressure bandwidth requirement, or a shaping size notification. In some embodiments, the write environment information is monitored based on a machine learning model or an artificial intelligence (AI) model.

In some embodiments, after monitoring a write workload from the host device 220, the memory system 200 dynamically adjust, e.g. by the memory controller 202, the size of the SLC cache 304 based on the write workload. For example, the size of the SLC cache 304 is increased as the write workload becomes higher, and the size of the SLC cache 304 is decreased as the write workload becomes lower.

In some embodiments, after monitoring a degree of data burstiness from the host device 220, the memory system 200 dynamically adjust, e.g. by the memory controller 202, the size of the SLC cache 304 based on the degree of data burstiness. For example, the size of the SLC cache 304 is increased as the degree of data burstiness becomes lower, and the size of the SLC cache 304 is decreased as the degree of data burstiness becomes higher.

In some embodiments, after monitoring a degree of write pressure from the host device 220, the memory system 200 dynamically adjust, e.g. by the memory controller 202, the size of the SLC cache 304 based on the degree of write pressure. In some examples, the size of the SLC cache 304 is increased when the degree of write pressure becomes higher and is smaller than a predetermined threshold. In some examples, the size of the SLC cache 304 is decreased when the degree of write pressure becomes lower and is smaller than the predetermined threshold. In some examples, the SLC cache 304 is disabled and data from the host device 220 is written directly to the plurality of XLC memory blocks in the XLC main memory portion 310 (without going through the SLC cache 304) when the degree of write pressure is larger than the predetermined threshold.

In some embodiments, the SLC cache 304 is initialized with a default size smaller than a predetermined threshold, and data is written into the plurality of XLC memory blocks in the XLC main memory portion 310 via the SLC cache 304 in the memory system 200 as a default mode.

In some embodiments, as the SLC cache 304 is configured to be a dynamic cache, which is engaged or disengaged with a dynamic size based on write shaping status and/or write environments, a single version of firmware in the memory system 200 is able to adapt to any use case for data writing in the memory system 200.

Figure 4:
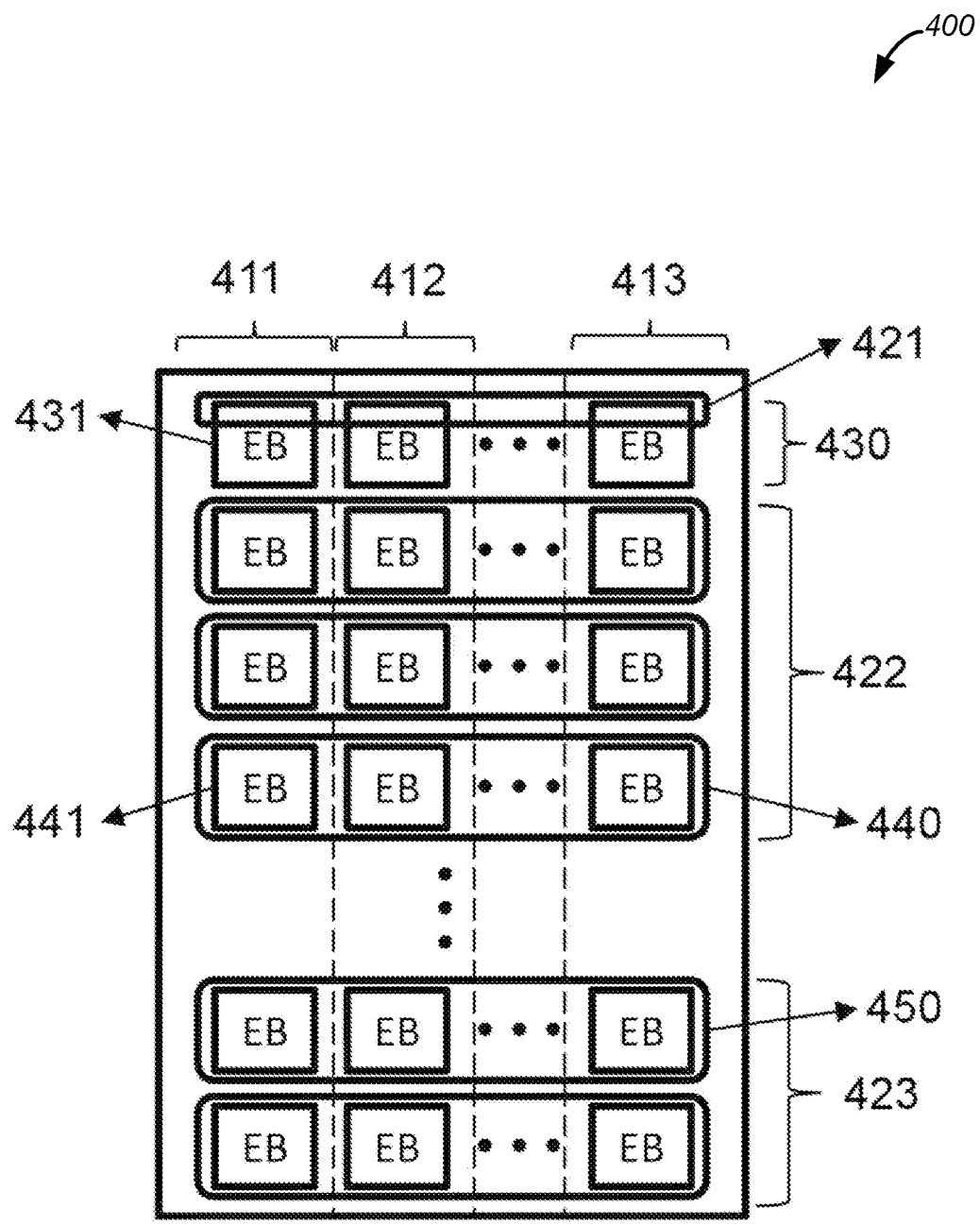
FIG. 4 is a block diagram of an example memory system supporting multiple bits per cell and including an SLC cache, in accordance with some embodiments of the present teaching.

FIG. 4 is a block diagram of an example memory system 400 supporting multiple bits per cell and including an SLC cache, in accordance with some embodiments of the present teaching. In some embodiments, the memory system 400 is a non-volatile NAND storage device configured to store instructions and data for an extended time, and may be implemented as the memory system 200 in FIG. 2 or FIG. 3. As shown in FIG. 4, the memory system 400 includes a plurality of erase blocks (EBs) 431, 441. In some embodiments, each of the plurality of EBs in the memory system 400 corresponds to a memory block 302 in the memory system 200. In some embodiments, a subset of the plurality of EBs (e.g. 3 EBs) corresponds to a memory block 302. In some embodiments, a subset of the plurality of EBs in the memory system 400 corresponds to two memory block 302, e.g., 3 EBs correspond to 3 decks of a pair of two memory blocks 302. Each EB includes a set of memory pages 210 that is erased jointly, independently of any other set of memory pages associated with any other EB. In the example shown in FIG. 4, the memory system 400 is divided into multiple dies 411, 412, 413 vertically, and is divided into multiple bands 421, 422, 423 horizontally.

Each of the multiple bands 421, 422, 423 includes a plurality of EBs having a same capacity usage level. In some examples, the memory system 400 is a PLC based memory. Accordingly, the memory system 400 includes an SLC band 421, one or more PLC bands 422, and one or more unallocated bands 423. In this example, the SLC band 421 is formed by a set of EBs 430 distributed across different dies 411, 412, 413. In some embodiments, the memory system 400 can only write one EB per die at a time. As such, distributing the EBs in the SLC band 421 across different dies can speed up writing process by writing data in the SLC EBs in the SLC band 421 in parallel. In this example, the SLC band 421 uses 20% available capacity in each EB in the SLC band 421. In some embodiments, the SLC band 421 includes merely one EB or a subset of the set of EBs 430.

As shown in FIG. 4, each of the PLC bands 422, e.g. the PLC band 440, is formed by a set of EBs distributed across different dies 411, 412, 413. In this example, each of the PLC bands 422 uses all available capacity in each EB in the PLC band.

As shown in FIG. 4, each of the unallocated bands 423, e.g. the unallocated band 450, is formed by a set of EBs distributed across different dies 411, 412, 413. In this example, each of the unallocated bands 423 is waiting to be allocated as an SLC band or a PLC band.

In some embodiments, when the SLC band 421 is enabled and engaged for data writing (e.g. based on a write shaping status of the host device), the memory system 400 stores host data from a host device by: writing the host data in the EBs in the SLC band 421, and moving data from the SLC band 421 to one or more EB in a PLC band when the SLC band 421 is full or reaches a predetermined amount of data storage. For example, the memory system 400 writes the host data in the SLC band 421, starting from the EB 431 and proceeding to other EBs in the SLC band 421, with a single bit per cell. In one example, when the SLC band 421 is full of data or reaches a predetermined amount of data storage (e.g. 10 MB or an enough size to complete a write cycle), the memory system 400 moves data in the SLC band 421 into the PLC EB 441, with 5 bits per cell. As such, the SLC band 421 serves as a memory cache during data writing in the memory system 400.

In some embodiments, when the SLC band 421 is disabled or disengaged for data writing (e.g. based on a write shaping status of the host device), the memory system 400 converts the SLC EBs in the SLC band 421 to PLC EBs, making use of the full capacity of each of the set of EBs 430. In some embodiments, when an SLC band is needed again in the memory system 400, the new SLC band can be created in the SLC band 421 again or in a different region of the memory system 400. In some embodiments, the PLC bands 422 are rotated to serve as an SLC band in the memory system 400, as the memory system 400 dynamically engages or disengages SLC write through for data writing.

In some embodiments, the memory system 400 can include any number of the SLC band(s) 421. Similarly, the memory system 400 can include any number of the PLC band(s) 422 and the unallocated band(s) 423. In some embodiments, the number of the SLC band(s) 421 in the memory system 400 is dynamically changed based on a write workload or write pressure detected from a host device coupled to the memory system 400. In some embodiments, the number of the SLC EBs in the SLC band 421 is dynamically changed based on a write workload or write pressure detected from the host device coupled to the memory system 400.

In some embodiments, the memory system 400 includes two SLC bands. In this case, while a full SLC band is being destaged to a PLC block, the other SLC band can absorb new write data from the host device. In some embodiments, the size of each SLC band matches the size needed to complete a full, multi-pass programming algorithm or full writing cycle on the PLC blocks.

In some embodiments, the memory system 400 includes a single SLC band that including 2*M EBs. In this case, while M SLC EBs in the single SLC band is being destaged to a PLC block, the other M SLC EBs in the SLC band can absorb new write data from the host device.

In some embodiments, under a heavy and sustained write pressure from the host device, more SLC bands are allocated by the memory system 400 to absorb that pressure, at the cost of PLC storage capacity. In some embodiments, under a bursty write pressure from the host device, fewer SLC bands are allocated by the memory system 400, with storage capacity returned from SLC to PLC.

In some embodiments, the memory system 400 includes one or more or any number of SLC bands. In the example shown in FIG. 4, the memory system 400 includes one SLC band 421 including a plurality of EBs. In some embodiments, the number of EB's in each SLC band can be configured based on a notification, e.g. a notification of NVMe Get/Set Features or host bandwidth requirement, from the host device. In some embodiments, each EB in the SLC band 421 has 10's of MB, and each EB in a PLC band (e.g. the PLC band 440) has 100's of MB.

As shown in FIG. 4, each band (SLC, PLC, or unallocated) contains 1 EB per die. In some embodiments, the number of dies 411, 412, 413 is configurable from 1 to 100's. In some embodiments, the band performance of the memory system 400 scales with the number of die/EB. In some embodiments, the memory system 400 uses a machine learning model or an AI model to monitor workload from the host device and tune a configuration of the SLC band 421 according to the workload.

In some embodiments, the memory system 400 automatically allocates a small SLC cache when it initializes. That is, the size of the SLC band 421 is small, when the memory system 400 is initialized. In some embodiments, all host writes go through the SLC cache (e.g. the SLC band 421) by default. The memory system 400 continuously monitors the write workload from the host device. If the host device is providing a large enough flow of write data for PLC programming, then the SLC cache is disabled and programming is performed directly from the host memory to the PLC EBs in PLC bands of the memory system 400. If the host device has a write pressure that is high but not enough for a complete PLC programming, then the size of the SLC cache is increased to provide more bandwidth.

Figure 5:
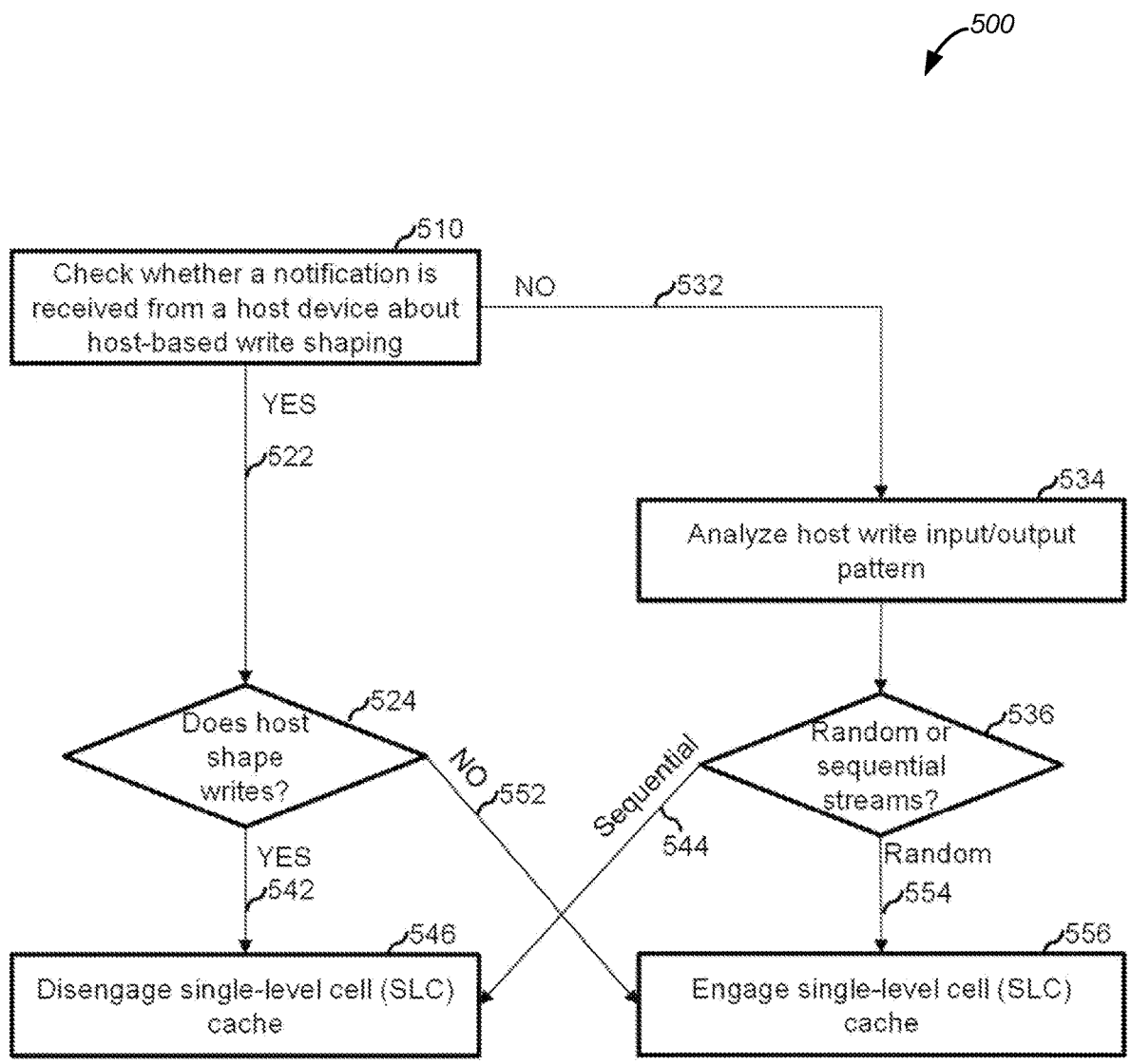
FIG. 5 is a flow diagram of an example method for dynamically engaging or disengaging an SLC cache in a memory device based on a write shaping status of a host device, in accordance with some embodiments of the present teaching.

FIG. 5 is a flow diagram of an example method 500 for dynamically engaging or disengaging an SLC cache in a memory device based on a write shaping status of a host device, in accordance with some embodiments of the present teaching. In some embodiments, the method 500 is performed by a memory device implemented as any of the memory systems 200, 400 in FIGS. 2-4. In some embodiments, the memory device stores data in XLC memory blocks with x bits per cell, where x is larger than 1. In some embodiments, the memory device dynamically generates and/or engages an SLC cache for caching write data for XLC memory blocks during data writing.

The memory device checks, at operation 510, whether a notification is received from a host device coupled to the memory device, where the notification is about host-based write shaping at the host device. In some embodiments, the notification is an IDC command or a GSF notification indicating whether the host device supports write shaping, e.g. accumulating write data to a predetermined size before sending them to the memory device for writing. In some embodiments, the operation 510 is performed during a device discovery process or an initialization process of the memory device.

In some situations, in accordance with a determination (at operation 522) that the notification about host-based write shaping is received from the host device, the memory device further determines, at operation 524, whether the host device shapes writes or performs write shaping based on the notification. In accordance with a determination (at operation 542) that the host device does shape writes, the memory device disengages, at operation 546, the SLC cache in the memory device. In some embodiments, memory blocks in the SLC cache are released to serve as XLC memory blocks for data writing after the operation 546, where write data from the host device is directly written into a XLC memory block of the memory device, without going through any SLC cache. In accordance with a determination (at operation 552) that the host device does not shape writes, the memory device engages, at operation 556, the SLC cache in the memory device, where write data from the host device is stored in the SLC cache before being destaged into a XLC memory block of the memory device.

Conversely, in some situations, in accordance with a determination (at operation 532) that the notification about host-based write shaping is not received from the host device, the memory device further analyzes, at operation 534, write input/output (I/O) pattern from the host device. Then, at operation 536, the memory device determines whether the write I/O pattern from the host device indicates sequential data streams or random data streams, e.g. with respect to logical block addressing (LBA). In accordance with a determination (at operation 544) that the write I/O pattern shows sequential data streams, the memory device disengages, at operation 546, the SLC cache in the memory device. In some embodiments, memory blocks in the SLC cache are released to serve as XLC memory blocks for data writing after the operation 546, where write data from the host device is directly written into a XLC memory block of the memory device, without going through any SLC cache. In accordance with a determination (at operation 554) that the write I/O pattern shows random data streams, the memory device engages, at operation 556, the SLC cache in the memory device, where write data from the host device is stored in the SLC cache before being destaged into a XLC memory block of the memory device.

Figure 6:
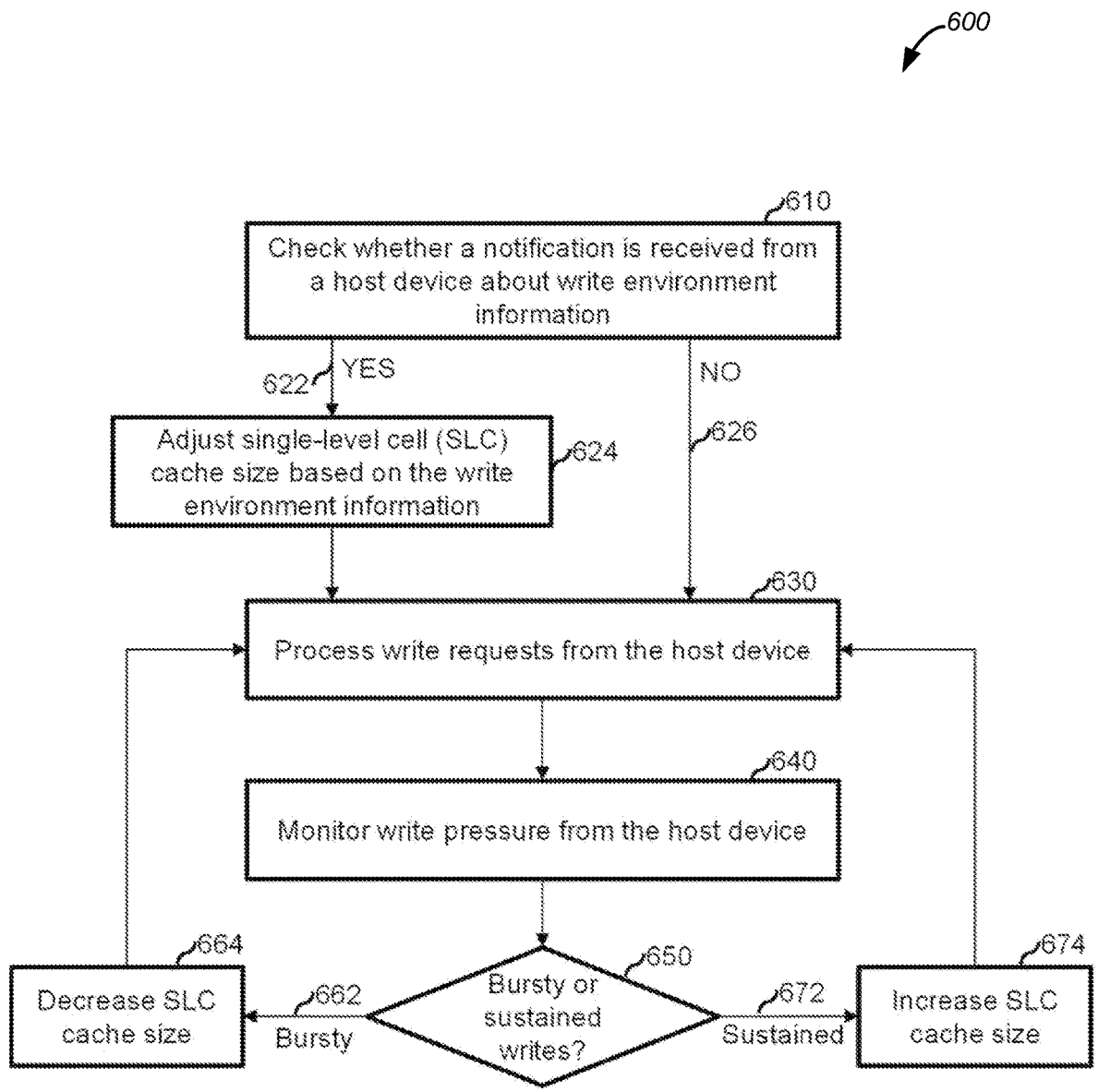
FIG. 6 is a flow diagram of an example method for dynamically adjusting a size of an SLC cache in a memory device based on a write shaping status of a host device, in accordance with some embodiments of the present teaching.

FIG. 6 is a flow diagram of an example method 600 for dynamically adjusting a size of an SLC cache in a memory device based on a write shaping status of a host device, in accordance with some embodiments of the present teaching. In some embodiments, the method 600 is performed by a memory device implemented as any of the memory systems 200, 400 in FIGS. 2-4. In some embodiments, the memory device stores data in XLC memory blocks with x bits per cell, where x is larger than 1. In some embodiments, the memory device dynamically adjust a size of an SLC cache for caching write data for XLC memory blocks during data writing.

The memory device checks, at operation 610, whether a notification is received from a host device coupled to the memory device, where the notification is about write environment information for the memory device. In some embodiments, the notification is an IDC command, a write workload notification or a write pressure notification. In some embodiments, the notification indicates an expected write workload or write pressure in a future data writing process from the host device to the memory device. In some embodiments, the notification indicates a type of the client environment, which hints about potential write pressure type. For example, a host device serving in a PC environment indicates a bursty write pressure, and a host device serving in a data center environment indicates a sustained write pressure. In some embodiments, the operation 610 is performed during a device discovery process or an initialization process of the memory device.

In some situations, in accordance with a determination (at operation 622) that the notification about write environment information is received from the host device, the memory device adjusts, at operation 624, a size of the SLC cache based on the write environment information. As such, the SLC cache with the adjusted size will be used for storing write data from the host device before destaging write data from the SLC cache into XLC memory blocks of the memory device. The method 600 then goes to operation 630, where the memory device processes write requests from the host device.

Conversely, in some situations, in accordance with a determination (at operation 626) that the notification about write environment information is not received from the host device, the method goes directly to the operation 630 to process write requests from the host device, with the size of the SLC cache unchanged.

At operation 640, the memory device monitors a write pressure (or write workload) from the host device. The memory device checks, at operation 650, whether the write pressure (or write workload) indicates bursty write data or sustained write data.

In accordance with a determination (at operation 662) that the write data is bursty (e.g. as a degree of data burstiness increases or is higher than a predetermined threshold), the memory device decreases, at operation 664, the size of the SLC cache in the memory device, e.g. by an amount or percentage that is determined based on the degree of data burstiness. Then, the method 600 goes back to the operation 630 to continue processing write requests from the host device.

Conversely, in accordance with a determination (at operation 672) that the write data is sustained (e.g. as the degree of data burstiness decreases or is lower than the predetermined threshold), the memory device increases, at operation 674, the size of the SLC cache in the memory device, e.g. by an amount or percentage that is determined based on the degree of data burstiness. Then, the method 600 goes back to the operation 630 to continue processing write requests from the host device.

In some embodiments, each threshold or adjust amount in the present teaching can be determined based on a machine learning model, an AI model, and/or historical data writing performance of the memory device.

Memory is also used to store instructions and data associated with the methods 500, 600, and includes high-speed random-access memory, such as DRAM, SRAM, DDR RAM, or other random access solid state memory devices: and, optionally, includes non-volatile memory, such as one or more magnetic disk storage devices, one or more optical disk storage devices, one or more flash memory devices, or one or more other non-volatile solid state storage devices. The memory, optionally, includes one or more storage devices remotely located from one or more processing units. Memory, or alternatively the non-volatile memory within memory, includes a non-transitory computer readable storage medium. In some embodiments, memory, or the non-transitory computer readable storage medium of memory, stores the programs, modules, and data structures, or a subset or superset for implementing methods 500, 600. Alternatively, in some embodiments, the electronic device implements the methods 500, 600 at least partially based on an ASIC. The memory system of the electronic device includes an SSD in a data center or a client device.

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various embodiments. In some embodiments, the memory, optionally, stores a subset of the modules and data structures identified above. Furthermore, the memory. optionally, stores additional modules and data structures not described above.

The terminology used in the description of the various described implementations herein is for the purpose of describing particular implementations only and is not intended to be limiting. As used in the description of the various described implementations and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including." "comprises." and/or "comprising." when used in this specification, specify the presence of stated features, integers, steps, operations, elements, and/or components, but do not preclude the presence or addition of one or more other features, integers, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

What is claimed is:

1. A method implemented at an electronic device including a host device and a memory device, comprising:
    identifying a write shaping status of the host device, wherein the memory device is coupled to the host device and includes a plurality of x-level cell (XLC) memory blocks, wherein x is greater than one:
    based on the write shaping status, determining that the host device performs write operations without a memory-based cache:
    in accordance with the determination that the host device performs write operations without the memory-based cache, allocating a y-level cell (YLC) cache in the memory device to act as the memory-based cache, wherein y is less than x; and
    in response to one or more write requests, storing data into the plurality of XLC memory blocks via the YLC cache in the memory device.

2. The method of claim 1, wherein the identifying the write shaping status comprises:
    receiving a notification by the memory device from the host device; and
    determining the write shaping status of the host device by determining, based on the notification, whether the host device supports write operations via the memory-based cache, wherein the YLC cache is allocated for writing data in the memory device when the host device does not support write operations via the memory-based cache.

3. The method of claim 2, wherein the notification comprises at least one of:
    an identify controller (IDC) command received during device discovery:
    a get/set features (GSF) notification:
    a write pressure bandwidth requirement;
    a write-shaping notification: or
    a shaping size notification.

4. The method of claim 1, wherein the identifying the write shaping status comprises:
    receiving at least one write command by the memory device from the host device for writing host data:
    detecting an input/output (I/O) pattern based on the at least one write command; and
    determining the write shaping status of the host device by determining whether the I/O pattern indicates sequential data regions or random data regions with respect to logical block addressing (LBA), wherein the YLC cache is allocated for writing data in the memory device when the I/O pattern indicates random data regions with respect to LBA.

5. The method of claim 1, wherein the storing data into the plurality of XLC memory blocks comprises:
    receiving host data from the host device according to the one or more write requests: and
    storing the host data in the memory device by:
        writing the host data in a plurality of memory blocks in the YLC cache, wherein each of the plurality of memory blocks is located in a different die of the memory device respectively, and
        moving data from the YLC cache to one memory block in the plurality of XLC memory blocks when the YLC cache is full or has enough data to complete a XLC program cycle.

6. The method of claim 1, further comprising:
    monitoring write environment information for writing data in the memory device: and
    dynamically adjusting a size of the YLC cache based on the write environment information.

7. The method of claim 6, wherein the write environment information comprises at least one of:
    information related to an identify controller (IDC) command received during device discovery:
    a write workload detected from the host device:
    a write pressure bandwidth requirement: or
    a shaping size notification.

8. The method of claim 6, further comprising:
    monitoring a write workload from the host device; and
    dynamically adjusting the size of the YLC cache based on the write workload, wherein:
        the size of the YLC cache is increased as the write workload becomes higher,
        the size of the YLC cache is decreased as the write workload becomes lower.

9. The method of claim 6, further comprising:
    monitoring a degree of data burstiness from the host device: and dynamically adjusting the size of the YLC cache based on the degree of data burstiness, wherein:
- the size of the YLC cache is increased as the degree of data burstiness becomes lower,
- the size of the YLC cache is decreased as the degree of data burstiness becomes higher.

10. The method of claim 6, further comprising:
monitoring a degree of write pressure from the host device; and
dynamically adjusting the size of the YLC cache based on the degree of write pressure, wherein:
- the size of the YLC cache is increased when the degree of write pressure becomes higher and is smaller than a predetermined threshold,
- the size of the YLC cache is decreased when the degree of write pressure becomes lower and is smaller than the predetermined threshold, and
- the YLC cache is disabled and data from the host device is written directly to the plurality of XLC memory blocks when the degree of write pressure is larger than the predetermined threshold.

11. The method of claim 6, wherein the write environment information is monitored based on a machine learning model or an artificial intelligence (AI) model.

12. The method of claim 1, further comprising:
initiating the YLC cache with a default size smaller than a predetermined threshold: and
writing data into the plurality of XLC memory blocks via the YLC cache in the memory device as a default mode.

13. A memory device, comprising:
a plurality of x-level cell (XLC) memory blocks, wherein x is greater than one:
a y-level cell (YLC) cache, wherein y is less than x; and
a memory controller operable to execute instructions which when executed cause the memory controller to perform operations comprising:
- identifying a write shaping status of a host device coupled to the memory device,
- based on the write shaping status, determining that the host device performs write operations without a memory-based cache, and
- in accordance with the determination that the host device performs write operations without the memory-based cache, storing data into the plurality of XLC memory blocks via the YLC cache in the memory device in response to one or more write requests from the host device.

14. The memory device of claim 13, wherein the identifying the write shaping status comprises:
receiving a notification from the host device: and
determining the write shaping status of the host device by determining, based on the notification, whether the host device supports write operations via the memory-based cache, wherein the YLC cache is allocated for writing data in the memory device when the host device does not support write operations via the memory-based cache.

15. The memory device of claim 14, wherein the notification comprises at least one of:
an identify controller (IDC) command received during device discovery:
a get/set features (GSF) notification:
a write pressure bandwidth requirement;
a write-shaping notification: or
a shaping size notification.

16. The memory device of claim 13, wherein the identifying the write shaping status comprises:
receiving at least one write command from the host device for writing host data:
detecting an input/output (I/O) pattern based on the at least one write command; and
determining the write shaping status of the host device by determining whether the I/O pattern indicates sequential data regions or random data regions with respect to logical block addressing (LBA), wherein the YLC cache is allocated for writing data in the memory device when the I/O pattern indicates random data regions with respect to LBA.

17. The memory device of claim 13, wherein the storing data into the plurality of XLC memory blocks comprises:
receiving host data from the host device according to the one or more write requests: and
storing the host data in the memory device by:
- writing the host data in a plurality of memory blocks in the YLC cache, wherein each of the plurality of memory blocks is located in a different die of the memory device respectively, and
- moving data from the YLC cache to one memory block in the plurality of XLC memory blocks when the YLC cache is full or has enough data to complete a XLC program cycle.

18. The memory device of claim 13, wherein the operations further comprise:
monitoring write environment information for writing data in the memory device; and
dynamically adjusting a size of the YLC cache based on the write environment information.

19. An electronic system, comprising:
a host device: and
a memory device coupled to the host device and configured to perform operations comprising:
- identifying a write shaping status of the host device, wherein the memory device is coupled to the host device and includes a plurality of x-level cell (XLC) memory blocks, wherein x is greater than one,
- based on the write shaping status, determining that the host device performs write operations without a memory-based cache,
- in accordance with the determination that the host device performs write operations without the memory-based cache, allocating a y-level cell (YLC) cache in the memory device to act as the memory-based cache, wherein y is less than x, and
- in response to one or more write requests, storing data into the plurality of XLC memory blocks via the YLC cache in the memory device.

20. The electronic system of claim 19, wherein the operations further comprise:
in accordance with a determination that the host device performs write operations via the memory-based cache, writing data from the host device directly to the plurality of XLC memory blocks without going through the YLC cache.

* * * * *